(12) United States Patent
Akatsuka et al.

(10) Patent No.: US 11,398,401 B2
(45) Date of Patent: Jul. 26, 2022

(54) WAFER MOUNTING TABLE AND METHOD OF MANUFACTURING THE SAME

(71) Applicant: NGK INSULATORS, LTD., Nagoya (JP)

(72) Inventors: Yuji Akatsuka, Handa (JP); Masaki Ishikawa, Handa (JP); Kazuhiro Nobori, Handa (JP); Akiyoshi Hattori, Nagoya (JP); Keiichi Nakamura, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 114 days.

(21) Appl. No.: 16/799,069

(22) Filed: Feb. 24, 2020

(65) Prior Publication Data
US 2020/0219755 A1    Jul. 9, 2020

Related U.S. Application Data

(63) Continuation of application No. PCT/JP2018/039066, filed on Oct. 19, 2018.
(Continued)

(51) Int. Cl.
*H01L 21/687* (2006.01)
*C04B 35/515* (2006.01)
(Continued)

(52) U.S. Cl.
CPC ...... *H01L 21/68757* (2013.01); *C04B 35/515* (2013.01); *H01J 37/32715* (2013.01); *H01L 21/6833* (2013.01); *H01L 21/68785* (2013.01)

(58) Field of Classification Search
None
See application file for complete search history.

(56) References Cited

U.S. PATENT DOCUMENTS

2009/0314433 A1    12/2009    Hoffman et al.
2017/0032935 A1*    2/2017    Benjamin .............. H01L 22/26
(Continued)

FOREIGN PATENT DOCUMENTS

| JP | H06-283595 A1 | 10/1994 |
| JP | H09-213455 A1 | 8/1997 |

(Continued)

OTHER PUBLICATIONS

English Machine translation of Ishida (JP-2003163259-A) retrieved from ESPACENET Oct. 8, 2021 (Year: 2021).*
(Continued)

*Primary Examiner* — Ram N Kackar
*Assistant Examiner* — Laureen Chan
(74) *Attorney, Agent, or Firm* — Burr & Brown, PLLC

(57) ABSTRACT

A wafer mounting table includes a first electrode and a second electrode buried inside of a ceramic substrate having a wafer mounting surface so as to be parallel to the wafer mounting surface with the first electrode closer to the wafer mounting surface than the second electrode. The wafer mounting table includes a conductive section that electrically conducts the first electrode and the second electrode. The conductive section is such that a plurality of circular members comprised of plate-shaped metal meshes parallel to the wafer mounting surface are stacked between the first electrode and the second electrode.

6 Claims, 7 Drawing Sheets

Related U.S. Application Data

(60) Provisional application No. 62/576,240, filed on Oct. 24, 2017.

(51) Int. Cl.
    *H01J 37/32*    (2006.01)
    *H01L 21/683*    (2006.01)

(56) References Cited

U.S. PATENT DOCUMENTS

2017/0170052 A1    6/2017    Takebayashi
2018/0374679 A1*  12/2018  Ito .................... H01J 37/32027

FOREIGN PATENT DOCUMENTS

| | | |
|---|---|---|
| JP | 2002-231798 A1 | 8/2002 |
| JP | 2003-163259 A1 | 6/2003 |
| JP | 2003163259 A * | 6/2003 |
| JP | 2011-525694 A1 | 9/2011 |
| TW | 201016078 A1 | 4/2010 |
| TW | 201642345 A | 12/2016 |

OTHER PUBLICATIONS

Taiwanese Office Action (Application No. 107137158) dated Jul. 29, 2021.
International Search Report and Written Opinion (Application No. PCT/JP2018/039066) dated Dec. 4, 2018.
English translation of the International Preliminary Report on Patentability (Chapter I) (Application No. PCT/JP2018/039066) dated May 7, 2020.

\* cited by examiner

WAFER MOUNTING TABLE AND METHOD OF MANUFACTURING THE SAME

BACKGROUND OF THE INVENTION

1. Field of the Invention

The present invention relates to a wafer mounting table and a method of manufacturing the wafer mounting table.

2. Description of the Related Art

A conventional wafer mounting table used for processing a wafer is known. As the wafer mounting table, a ceramic heater, an electrostatic chuck, a susceptor, (which includes an electrode for plasma generation) and others are available. For instance, PTL 1 discloses a wafer mounting table in which a disc-shaped first electrode and a ring-shaped second electrode are buried inside of a ceramic substrate having a wafer mounting surface so as to be parallel to the wafer mounting surface with the first electrode closer to the wafer mounting surface than the second electrode, the ring-shaped second electrode having an outer diameter larger than that of the first electrode. The first electrode and the second electrode are electrically connected via a conductive section. PTL 1 discloses a conductive section comprised of a metal mesh bent in zigzag as illustrated in FIG. 9.

CITATION LIST

Patent Literature

PTL 1: Japanese Unexamined Patent Application Publication No. 2003-163259

SUMMARY OF THE INVENTION

Incidentally, when plasma treatment is performed on a wafer mounted on a wafer mounting table, a high frequency current flows through the conductive section. When the conductive section in FIG. 9 is adopted then, a conductive path between the first electrode and the second electrode is zigzag, thus significantly longer than the distance between the first electrode and the second electrode, and the impedance when a high frequency current flows is increased. As a consequence, the amount of heat generation in the conductive section is increased, and an upper portion of the conductive section has an abnormally high temperature, which causes a problem in that thermal uniformity deteriorates.

The present invention has been devised to cope with such a problem, and it is the main object to achieve favorable thermal uniformity of a wafer in a wafer mounting table in which the first electrode and the second electrode parallel to each other are buried to be conductive via the conductive section.

A wafer mounting table of the present invention comprises a first electrode and a second electrode buried inside of a ceramic substrate having a wafer mounting surface so as to be parallel to the wafer mounting surface; and a conductive section that electrically connects the first electrode and the second electrode with the first electrode closer to the wafer mounting surface than the second electrode, wherein the conductive section is such that a plurality of plate-shaped metal mesh members parallel to the wafer mounting surface are stacked between the first electrode and the second electrode.

In the wafer mounting table, the conductive section is such that a plurality of plate-shaped metal mesh members parallel to the wafer mounting surface are stacked between the first electrode and the second electrode. In such a conductive section, the conductive path has a length substantially equal to the distance between the first electrode and the second electrode. In addition, the metal mesh members are in contact with each other at many points, thus the impedance when a high frequency current flows is decreased as compared with a metal mesh bent in zigzag, for instance. Therefore, an upper portion of the conductive section can be prevented from having an abnormally high temperature, and the thermal uniformity of the wafer becomes favorable.

It is to be noted that "parallel" includes the case of substantially parallel (for instance, the case within a range of tolerance) in addition to the case of completely parallel.

In the wafer mounting table of the present invention, it is preferable that the material of the ceramic substrate be included in the mesh space of the metal mesh members. In this manner, advantage in strength is achieved.

In the wafer mounting table of the present invention, the first electrode and the second electrode may be used as electrostatic electrodes, used as RF electrodes, or used as both an electrostatic electrode and an RF electrode.

In the wafer mounting table of the present invention, the first electrode may be a disc electrode, and the second electrode may be a disc electrode or a ring-shaped electrode which is larger than the first electrode in diameter, and concentric to the first electrode. However, it is preferable that each of the first electrode and the second electrode be a disc electrode. In the case where the first electrode is a disc electrode and the second electrode is a ring-shaped electrode, when the first electrode is viewed from the above of the wafer mounting surface, the first electrode includes an overlapping portion (a portion provided with the conductive section) which overlaps with the second electrode and a non-overlapping portion which does not overlap with the second electrode. Thus, there is a possibility that an effect given to the wafer is different between the overlapping portion and the non-overlapping portion. In contrast, in the case where each of the first electrode and the second electrode is a disc electrode, when the first electrode is viewed from the above of the wafer mounting surface, the first electrode in its entirety overlaps with the second electrode, thus there is no such possibility.

In the wafer mounting table of the present invention, the ceramic substrate may have a ring-shaped step surface which is outside of and lower than the wafer mounting surface, the first electrode may be provided to be opposed to the wafer mounting surface, and at least part of the second electrode may be provided to be opposed to the ring-shaped step surface. In this manner, the ring-shaped step surface may be utilized as a surface on which a focus ring is mounted.

The method of manufacturing a wafer mounting table of the present invention includes:

(a) a step of digging a hole for placing a conductive section from one of surfaces of a ceramic pressure molded body in which a first electrode or its precursor are buried up to the first electrode or the precursor;

(b) a step of stacking and inserting a plurality of plate-shaped metal mesh members in the hole to be parallel to the first electrode or the precursor so that an uppermost one of the metal mesh members reaches an opening of the hole;

(c) a step of providing a second electrode or its precursor in the one of the surfaces of the ceramic pressure molded body so as to be parallel to the first electrode and in contact with the uppermost one of the metal mesh members;

(d) a step of obtaining a laminated body by spreading ceramic powder so as to cover the second electrode or the precursor, and performing pressure molding on the one of the surfaces of the ceramic pressure molded body; and (e) a step of performing hot press calcination on the laminated body.

The method of manufacturing a wafer mounting table is suitable for manufacturing one of the above-described wafer mounting tables. In the method of manufacture, a conductive section is produced by stacking a plurality of plate-shaped metal mesh members. A multilayer body obtained by stacking a plurality of metal mesh members has contractility. Therefore, at the time of hot press calcination, the multilayer body does not prevent ceramic powder from being calcined and contracted. In addition, the distance between the first electrode and the second electrode is easily controlled.

In the method of manufacturing a wafer mounting table of the present invention, in step (b), a plurality of metal mesh members are stacked and inserted in the hole, then ceramic powder may be inserted in the hole, and the mesh space of the metal mesh members may be filled with the ceramic powder. In this manner, the ceramic powder is included in the mesh space of the metal mesh members, thus crack is unlikely to occur in the ceramic substrate at the time of calcination, as compared with the case where the mesh space is hollow.

It is to be noted that the precursor of the first electrode is what turns into the first electrode after calcination, and for instance, is a printed matter of a conductive paste. The same goes with the precursor of the second electrode.

DETAILED DESCRIPTION OF THE INVENTION

Figure 1:
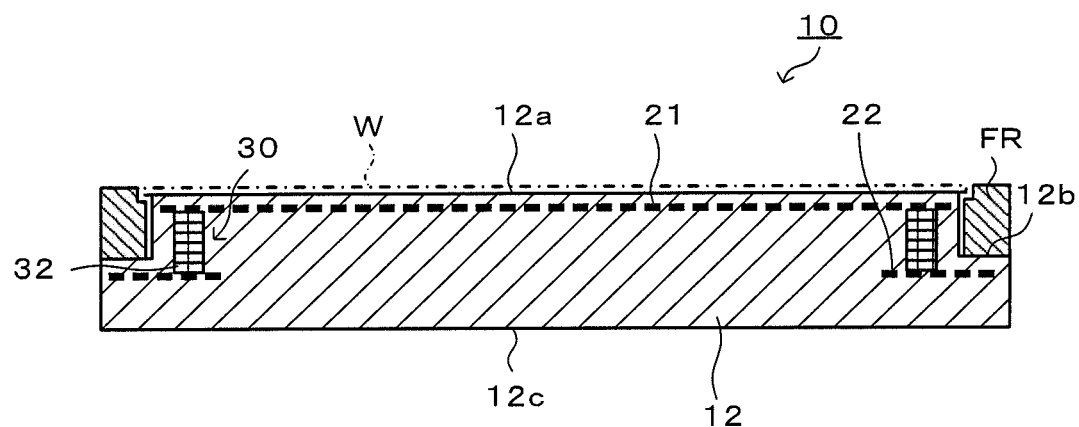
FIG. 1 is a vertical cross-sectional view of a wafer mounting table 10.
Figure 2:
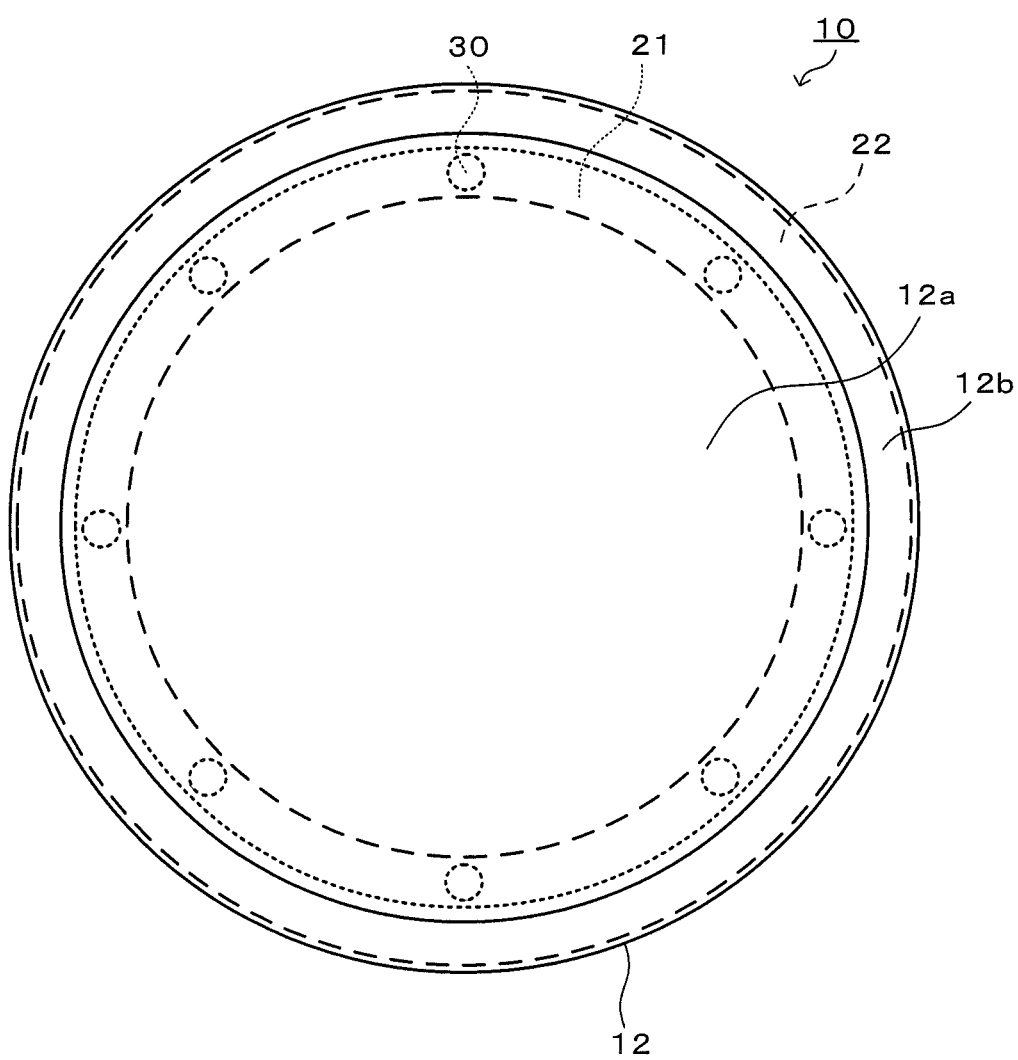
FIG. 2 is a plan view of the wafer mounting table 10.
Figure 3:
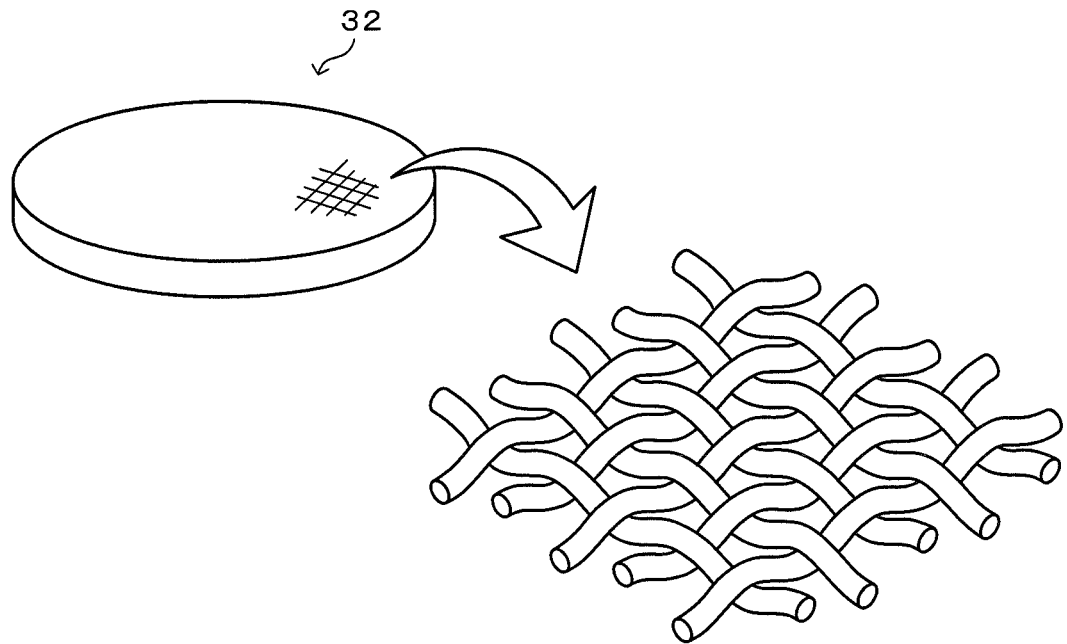
FIG. 3 is a perspective view of a circular member 32.
Figure 4:
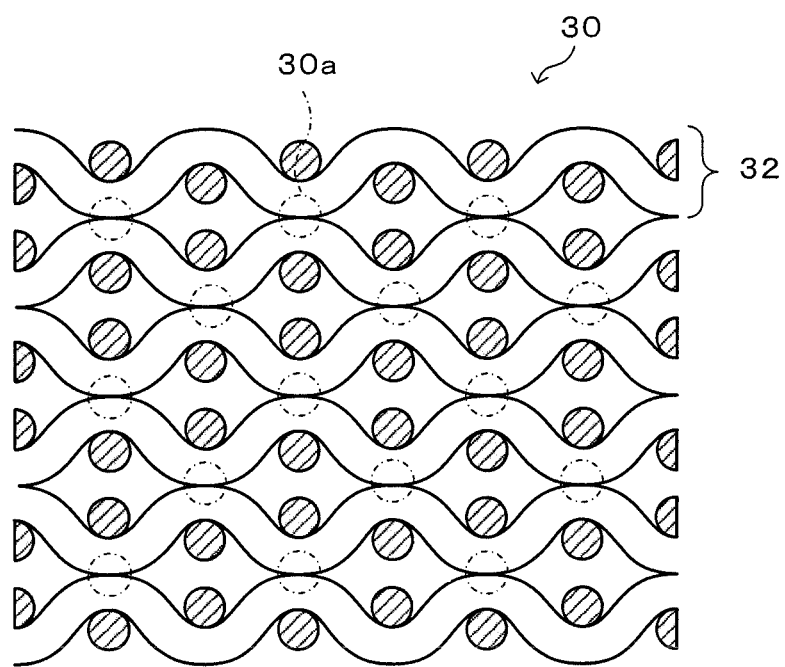
FIG. 4 is a cross-sectional view of a conductive section 30.

A preferred embodiment of the present invention will be described below with reference to the drawings. FIG. 1 is a vertical cross-sectional view (a cross-sectional view when a ceramic substrate 12 is cut along a plane through its central axis) of a wafer mounting table 10, FIG. 2 is a plan view of the wafer mounting table 10, FIG. 3 is a perspective view of a circular member 32, and FIG. 4 is a cross-sectional view of a conductive section 30. It is to be noted that a focus ring FR is omitted in FIG. 2.

The wafer mounting table 10 is used for performing CVD or etching on a wafer W by utilizing plasma, and is mounted on a chamber (not illustrated) for semiconductor process. The wafer mounting table 10 includes a first electrode 21, a second electrode 22, and the conductive section 30 inside the ceramic substrate 12.

The ceramic substrate 12 is a disc-shaped plate comprised of a ceramic material represented by aluminum nitride, silicon carbide, silicon nitride, aluminium oxide, and others. The ceramic substrate 12 includes a circular wafer mounting surface 12a, a focus ring mounting surface 12b lower than the wafer mounting surface 12a by one level outwardly of the wafer mounting surface 12a, and a back surface 12c on the side opposite to the wafer mounting surface 12a. The first electrode 21 and the second electrode 22 are buried inside of the ceramic substrate 12 so as to be parallel (including the case of substantially parallel, and the same applies to the following) to the wafer mounting surface 12a with the first electrode 21 closer to the wafer mounting surface 12a than the second electrode 22. A plurality of depressions and projections which are not illustrated are formed by embossing on the wafer mounting surface 12a and the focus ring mounting surface 12b of the ceramic substrate 12. A gas (for instance, a He gas) for thermal conduction is supplied between the depressions provided in the wafer mounting surface 12a and the wafer W mounted on the wafer mounting surface 12a and between the depressions provided in the focus ring mounting surface 12b and the focus ring FR mounted on the focus ring mounting surface 12b through a gas supply path from the side of the back surface 12c, the gas supply path being not illustrated. The focus ring FR includes a step along the inner circumference of the upper end so as not to interfere with the wafer W.

The first electrode 21 is a disc electrode concentric to the ceramic substrate 12, and is provided to be opposed to the wafer mounting surface 12a. The first electrode 21 is formed of a metal mesh or a metal plate with the main component of molybdenum, tungsten, or tungsten carbide. When the wafer W mounted on the wafer mounting surface 12a is electrostatically adsorbed, a DC voltage is applied to the first electrode 21. The first electrode 21 is connected to a power feed rod (not illustrated) inserted in the back surface 12c of the ceramic substrate 12, and a DC voltage is applied to the first electrode 21 via the power feed rod.

The second electrode 22 is a ring-shaped electrode having an outer diameter larger than that of the first electrode 21 and concentric to the ceramic substrate 12, and is provided to be opposed to the focus ring mounting surface 12b. The second electrode 22 is formed of a metal mesh or a metal plate which is the same material as the first electrode 21. When the focus ring FR mounted on the focus ring mounting surface 12b is electrostatically adsorbed, a DC voltage is applied to the second electrode 22. The second electrode 22 is electrically connected to the first electrode 21 via the conductive section 30. Therefore, when a DC voltage is applied to the first electrode 21, a DC voltage is also applied to the second electrode 22 accordingly.

The conductive section 30 is provided between the first electrode 21 and the second electrode 22, and is such that a plurality of circular members 32 (see FIG. 3) parallel to the wafer mounting surface 12a are stacked. As illustrated in FIG. 2, multiple pieces (8 pieces herein) of the conductive section 30 are provided at equal intervals along the circumferential direction of the wafer mounting table 10. The circular members 32 are formed of a metal mesh with the same material as the first electrode 21. The metal mesh preferably has a wire diameter of 0.1 to 0.5 mm, and the number of grids per inch is preferably 20 to 50. The plurality of circular members 32 are overlapped with each other on the surface. Therefore, two circular members 32 in contact with each other have a great number of point contact sections 30a (see FIG. 4). Also, a conductive path formed between the first electrode 21 and the second electrode 22 in the conductive section 30 has a length substantially equal to the distance between the first electrode 21 and the second electrode 22.

Next, an example of manufacturing the wafer mounting table 10 will be described using FIGS. 5A to 5F. FIGS. 5A to 5F show explanatory views illustrating the steps of manufacturing the wafer mounting table 10.

Figure 5A:
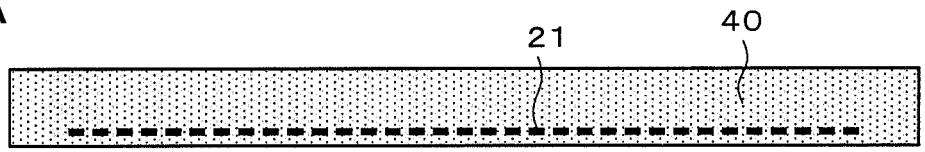
FIGS. 5A to 5F show views of manufacturing steps for the wafer mounting table 10.

First, a disc-shaped ceramic pressure molded body 40 including the first electrode 21 is produced using ceramic powder having an average particle diameter of several "m to several 10 μm (see FIG. 5A). At this point, the first electrode 21 is made parallel to the upper surface and the lower surface of the ceramic pressure molded body 40.

Figure 5B:
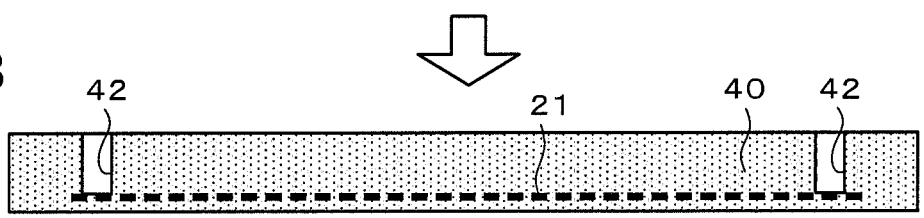

Subsequently, a hole 42 reaching the first electrode 21 is dug at a position where the conductive section 30 is provided in the upper surface of the ceramic pressure molded body 40 (see FIG. 5B).

Figure 5C:
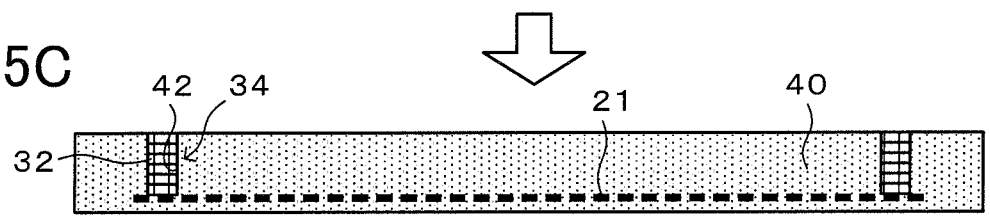

Subsequently, the plurality of circular members 32 are stacked parallel to the first electrode 21 and inserted in the hole 42 to form the multilayer body 34, then the mesh space of the circular members 32 is further filled with ceramic powder (see FIG. 5C). The circular members 32 are each a metal mesh, and the wire diameter and the number of grids per inch are within the above-described numerical ranges. Thus, the multilayer body 34 with the plurality of circular members 32 stacked is relatively close to a bulk (solid cylindrical body) after calcination contraction by hot press. For this reason, the ceramic powder filled in the mesh space of the circular members 32 is relatively small in amount.

Figure 5D:
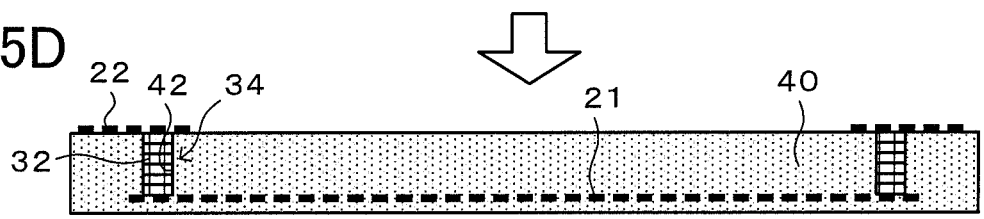

Subsequently, the ring-shaped second electrode 22 is placed on the upper surface of the ceramic pressure molded body 40 so as to be parallel to the first electrode 21 (see FIG. 5D). At this point, the second electrode 22 is in contact with the uppermost one of the circular members 32 in the multilayer body 34.

Figure 5E:
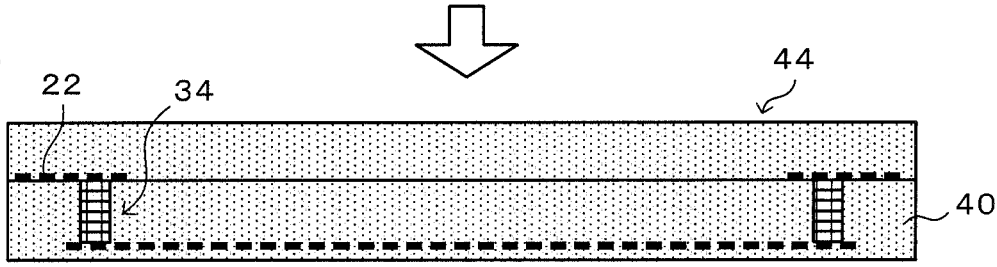

Subsequently, the ceramic pressure molded body 40 with the second electrode 22 placed is inserted into a mold, ceramic powder is spread over the upper surface of the ceramic pressure molded body 40 so as to cover the second electrode 22, and pressure molding is performed, thereby obtaining a laminated body 44 (see FIG. 5E).

Figure 5F:
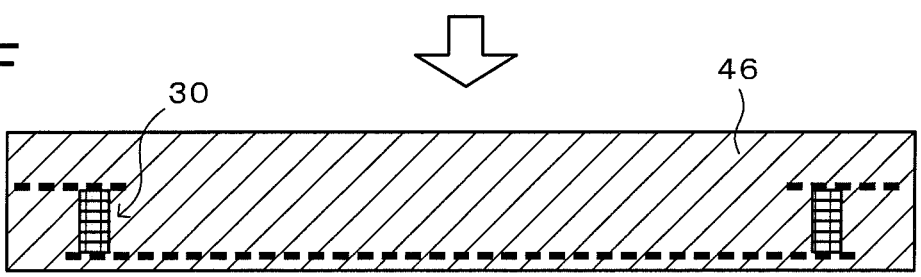
Figure 6:
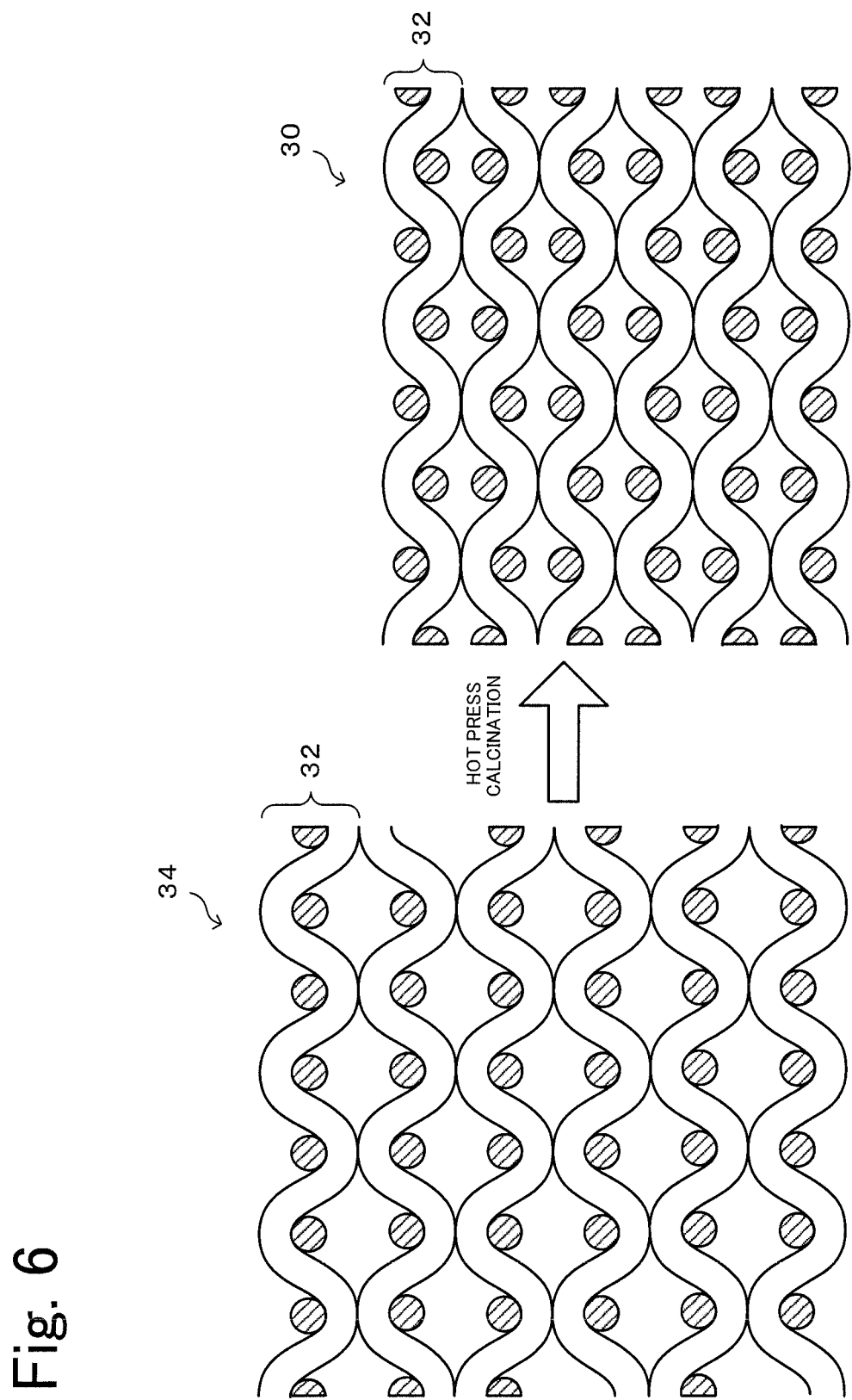
FIG. 6 shows cross-sectional views of a plurality of stacked circular members 32 before and after hot press calcination.

Subsequently, hot press calcination is performed on the laminated body 44 (see FIG. 5F). Consequently, the ceramic powder contained in the laminated body 44 is sintered and turns into a disc-shaped ceramic substrate 46. Also, the multilayer body 34 turns into the conductive section 30. As illustrated in FIG. 6, the multilayer body 34 with the plurality of circular members 32 stacked is contracted in a vertical direction to the surface at the time of hot press calcination, thus the ceramic powder is not prevented from being sintered and contracted. Subsequently, the outer circumferential portion of the lower surface of the disc-shaped ceramic substrate 46 is polished to form a step, and thus the ceramic substrate 12 including the wafer mounting surface 12a and the focus ring mounting surface 12b is obtained.

Figure 7:
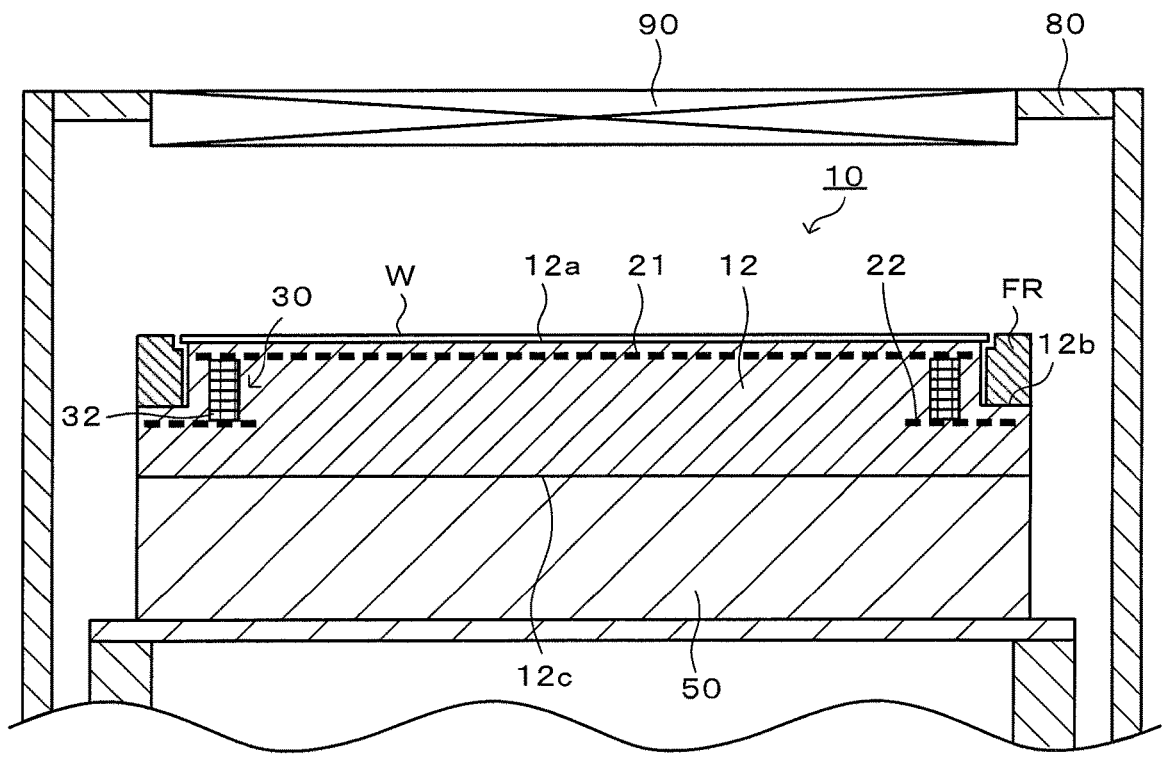
FIG. 7 is an explanatory view illustrating an example of use of the wafer mounting table 10.

Next, an example of use of the wafer mounting table 10 will be described using FIG. 7. FIG. 7 is an explanatory view illustrating an example of use of the wafer mounting table 10.

After a cooling plate 50 made of metal is mounted on the back surface 12c of the ceramic substrate 12, the wafer mounting table 10 is installed in a chamber 80. In the chamber 80, a shower head 90 is installed at the position opposed to the wafer mounting table 10.

The disc-shaped wafer W is mounted on the wafer mounting surface 12a of the wafer mounting table 10, the focus ring FR is mounted on the focus ring mounting surface 12b, and a DC voltage is applied to the first electrode 21 via a power feed rod which is not illustrated. Then, a DC voltage is also applied to the second electrode 22 which is electrically connected to the first electrode 21 via the conductive section 30. Thus, the wafer W is electrostatically adsorbed to the wafer mounting surface 12a, and the focus ring FR is electrostatically adsorbed to the focus ring mounting surface 12b. The temperature of the wafer W and the temperature of the focus ring FR can be controlled by adjusting the temperature of a cooling medium supplied to a cooling medium path of the cooling plate 50 mounted on the back surface of the wafer mounting table 10, the cooling medium path being not illustrated.

In this state, the inside of the chamber 80 is set to a predetermined vacuum atmosphere (or a depressurized atmosphere), and high frequency power is supplied between the cooling plate 50 and the shower head 90 to generate a plasma while a process gas is supplied from the shower head 90. Then, CVD film formation is performed and etching is performed on the wafer W by utilizing the plasma. Although the focus ring FR is also consumed along with plasma treatment of the wafer W, the focus ring FR is replaced after several pieces of the wafer W are processed because the focus ring FR has a large thickness.

Figure 9:
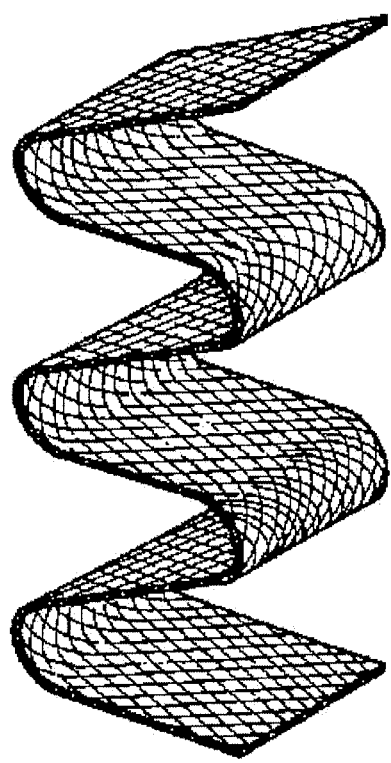
FIG. 9 is a perspective view of a conductive section comprised of a metal mesh bent in zigzag.

In the wafer mounting table 10 described above, when plasma treatment is performed on the wafer W, a high frequency current flows through the conductive section 30. The conductive section 30 is such that a plurality of circular members 32 comprised of plate-shaped metal meshes parallel to the wafer mounting surface 12a are stacked between the first electrode 21 and the second electrode 22. In the conductive section 30, a conductive path has a length substantially equal to the distance between the first electrode 21 and the second electrode 22, and moreover, the metal meshes are in contact with each other at many points, thus the impedance when a high frequency current flows is decreased as compared with the metal mesh bent in zigzag of FIG. 9, for instance. Therefore, an upper portion of the conductive section 30 can be prevented from having an abnormally high temperature, and the thermal uniformity of the wafer W becomes favorable.

Also, since the material of the ceramic substrate 12 is included in the mesh space of the circular members 32, advantage in strength is achieved.

Furthermore, since the conductive section 30 is produced by stacking a plurality of circular members 32 in the manufacturing steps of FIGS. 5A to 5F, the ceramic powder is not prevented from being sintered and contracted at the time of hot press calcination. In addition, the distance between the first electrode 21 and the second electrode 22 is easily controlled. The force to cause the wafer W to be adsorbed to the wafer mounting surface 12a depends on the thickness of the layer (a first dielectric layer) between the first electrode 21 and the wafer mounting surface 12a in the ceramic substrate 12, and the force to cause the focus ring FR to be adsorbed to the focus ring mounting surface 12b depends on the thickness of the layer (a second dielectric layer) between the second electrode 22 and the focus ring mounting surface 12b in the ceramic substrate 12. Although the thickness of the first dielectric layer and the thickness of the second dielectric layer often have different design values, the thickness of the first dielectric layer and the thickness of the second dielectric layer can be easily matched to the respective design values by adopting the manufacturing steps of FIGS. 5A to 5F.

Moreover, since the ceramic powder is included in the mesh space of the circular members 32 in the hole 42 before hot press calcination, crack is unlikely to occur in the ceramic substrate 12 after the calcination, as compared with the case where the mesh space is hollow.

It is needless to say that the present invention is not limited to the above-described embodiment in any way, and may be practiced in various modes as long as the modes belong to the technical scope of the present invention.

Figure 8:
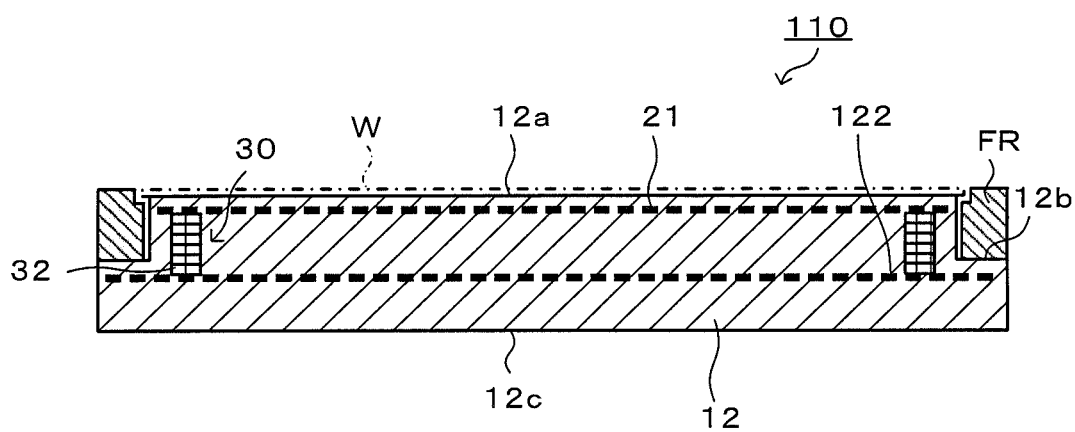
FIG. 8 is a vertical cross-sectional view of a wafer mounting table 110.

For instance, although the second electrode 22 is a ring-shaped electrode in the above-described embodiment, a second electrode 122 may be a disc electrode, like a wafer mounting table 110 of FIG. 8, which has an outer diameter larger than that of the first electrode 21. In FIG. 8, the same components as those of the above-described embodiment are labeled with the same symbols. In the case where the first electrode 21 is a disc electrode and the second electrode 22 is a ring-shaped electrode, when the first electrode 21 is viewed from the above of the wafer mounting surface 12a, the first electrode 21 includes an overlapping portion (a portion provided with the conductive section 30) which overlaps with the second electrode 22 and a non-overlapping portion which does not overlap with the second electrode 22. Thus, there is a possibility that an effect given to the wafer W is different between the overlapping portion and the non-overlapping portion. In contrast, in the case where each of the first and second electrodes 21, 122 is a disc electrode as in FIG. 8, when the first electrode 21 is viewed from the above of the wafer mounting surface 12a, the first electrode 21 in its entirety overlaps with the second electrode 122, thus there is no such possibility.

In the above-described embodiment, a resistance heating element may be buried in the ceramic substrate 12. In that case, a resistance heating element which heats the wafer W mounted on the wafer mounting surface 12a and a resistance heating element which heats the focus ring FR mounted on the focus ring mounting surface 12b may be independently provided. Alternatively, a zone for heating the wafer W may be divided into multiple subzones, and a resistance heating element may be provided in each of the subzones.

In the above-described embodiment, the case has been exemplified, in which the first and second electrodes 21, 22 are used as electrostatic electrodes. However, the first and second electrodes 21, 22 may be used as an electrostatic electrode as well as an RF electrode. In this case, high frequency power is supplied between the first and second electrodes 21, 22, and the shower head 90 to generate a plasma. It is to be noted that the first and second electrodes 21, 22 may be each used as an RF electrode, not as an electrostatic electrode.

In the above-described embodiment, a description has been given in which a DC voltage is applied to the first electrode 21 via a power feed rod which is inserted in the back surface 12c of the ceramic substrate 12, the power feed rod being not illustrated. However, alternatively, a DC voltage may be applied to the second electrode 22 via a power feed rod which is inserted in the back surface 12c of the ceramic substrate 12, the power feed rod being not illustrated. In this case, since the first electrode 21 is electrically connected to the second electrode 22 via the conductive section 30, when a DC voltage is applied to the second electrode 22, a DC voltage is also applied to the first electrode 21 accordingly.

This application is based on and claims priority of U.S. Provisional Patent Application No. 62/576,240, filed on Oct. 24, 2017, the entire contents of which are incorporated herein by reference.

What is claimed is:

1. A wafer mounting table comprising a first electrode and a second electrode buried inside of a ceramic substrate having a wafer mounting surface so as to be parallel to the wafer mounting surface; and a conductive section that electrically connects the first electrode and the second electrode, which have a vertical distance therebetween, with the first electrode closer to the wafer mounting surface than the second electrode,
wherein the conductive section comprises a plurality of circular members, which are formed of a metal mesh, such that the circular members extend horizontally and are vertically stacked on one another, with each circular member being in electrical contact with an immediately adjacent circular member such that the plurality of circular members form a substantially cylindrical body that has a continuous vertical conductive path having a length between the first electrode and the second electrode, and the length of the continuous vertical conductive path of the conductive section is substantially equal to the vertical distance between the first electrode and the second electrode.

2. The wafer mounting table according to claim 1,
Wherein a material of the ceramic substrate is included in a mesh space of the circular members.

3. The wafer mounting table according to claim 1,
wherein the first electrode and the second electrode are used as electrostatic electrodes, used as RF electrodes, or used as both an electrostatic electrode and an RF electrode.

4. The wafer mounting table according to claim 1,
wherein the first electrode is a disc electrode, and the second electrode is a disc electrode or a ring-shaped electrode which is larger than the first electrode in diameter, and concentric to the first electrode.

5. The wafer mounting table according to claim 1,
wherein the ceramic substrate has a ring-shaped step surface which is outside of and lower than the wafer mounting surface,
the first electrode is provided to be opposed to the wafer mounting surface, and
the second electrode is provided to be opposed to the ring-shaped step surface.

6. A method of manufacturing the wafer mounting table of claim 1, the method comprising:
(a) a step of digging a hole for placing a conductive section from one of surfaces of a ceramic pressure molded body in which a first electrode or its precursor is buried up to the first electrode or the precursor;
(b) a step of stacking and inserting a plurality of plate-shaped metal mesh members in the hole to be parallel to the first electrode or the precursor so that an uppermost one of the metal mesh members reaches an opening of the hole;
(c) a step of providing a second electrode or its precursor in the one of the surfaces of the ceramic pressure molded body to be parallel to the first electrode and in contact with the uppermost one of the metal mesh members;

(d) a step of obtaining a laminated body by spreading ceramic powder on the one of the surfaces of the ceramic pressure molded body to cover the second electrode or the precursor, and performing pressure molding on the ceramic powder; and (e) a step of performing hot press calcination on the laminated body.

\* \* \* \* \*